(12) United States Patent
Chen

(10) Patent No.: US 7,456,685 B2
(45) Date of Patent: Nov. 25, 2008

(54) CLASS D AUDIO AMPLIFIER WITH PWM AND FEEDBACK

(75) Inventor: Wei Chen, Campbell, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 108 days.

(21) Appl. No.: 11/369,251

(22) Filed: Mar. 7, 2006

(65) Prior Publication Data
US 2007/0210861 A1    Sep. 13, 2007

(51) Int. Cl.
H03F 3/38    (2006.01)

(52) U.S. Cl. .......................... 330/10; 330/251

(58) Field of Classification Search ............. 330/10, 330/207 A, 251
See application file for complete search history.

(56) References Cited

U.S. PATENT DOCUMENTS

| 6,118,336 | A * | 9/2000 | Pullen et al. ............... 330/10 |
| 6,300,825 | B1 * | 10/2001 | Dijkmans et al. ............ 330/10 |
| 6,728,368 | B1 * | 4/2004 | Mohajeri .................... 379/377 |
| 7,239,200 | B2 * | 7/2007 | Ishii et al. .................. 330/10 |
| 7,262,658 | B2 * | 8/2007 | Ramaswamy et al. ....... 330/251 |
| 7,312,654 | B2 * | 12/2007 | Roeckner et al. ............ 330/10 |

* cited by examiner

Primary Examiner—Henry K Choe
(74) Attorney, Agent, or Firm—Perkins Coie LLP; Zhou Lu

(57) ABSTRACT

The present invention introduces methods and systems to amplify digital audio signals for driving speakers. First, digital audio signals are converted to PWM audio signals by a liner PWM modulator that is open-loop. Then, PWM audio signals are amplified by a Class D audio amplifier that has at least one feedback loop.

30 Claims, 3 Drawing Sheets

CLASS D AUDIO AMPLIFIER WITH PWM AND FEEDBACK

TECHNICAL FIELD

The present invention relates generally to audio signal processing, and in particular, relates to a system that includes a Class D amplifier for audio signal amplification and other audio signal processing.

BACKGROUND

A Class-D audio amplifier is more efficient than a linear amplifier, such as a Class A/B amplifier, since its output stage operates in switch mode, thereby minimizing power consumption. The rectangular waveform produced by the output stage can be used to power an audio speaker. Sometimes, additional filters are added between the output stage and the audio speaker. The filtered signal is an amplified version of the input audio signal.

It has become more common that audio signals are in digital format and deciphered by a system decoder. The digital audio signals are processed by an audio processing system containing a class D audio amplifier to generate high power audio signals to drive a speaker.

In a conventional method, illustrated in FIG. 1A, the audio processing system contains a high resolution/high speed D/A converter and a closed-loop Class D audio amplifier. The high resolution/high speed D/A is required to convert an audio signal from the digital format into the analog format. The class D audio amplifier then amplifies the analog audio signal to drive a speaker. An audio output with very low distortion can be obtained. The disadvantage of this method is that the analog audio input of the audio amplifier is subject to noise which in turn degrades the quality of the output signal.

In another conventional method, illustrated in FIG. 1B, the audio process system contains a complex pulse width modulation (PWM) modulator, a high resolution/high speed A/D converter, and an open-loop power stage. First, the PWM modulator converts an audio signal from the digital format to the PWM format. In order to improve the power-supply rejection ratio (PSRR) and overcome the non-linear distortion in the output switching network, the output signal must be fed back through a high speed and high resolution A/D converter to the PWM modulator. This method avoids the noise associated with the analog audio input signal. However, the complex PWM modulator and the high speed A/D converter are costly components.

Accordingly, a simpler solution is needed to achieve a high quality output signal in Class D audio amplifier application with minimized noise interference.

BRIEF DESCRIPTION OF DRAWINGS

The following Figures illustrate embodiments of the invention. These Figures and embodiments provide examples of the invention and they are non-limiting and non-exhaustive.

DETAILED DESCRIPTION

Embodiments of a system and method that uses an audio amplifier and accompanying circuitry to achieve highly efficient audio signal amplification and other audio signal processes are described in detail herein. The audio amplifier receives a digital PWM audio signal and has a feedback loop(s) from the output signal limited within the audio amplifier, which eliminates the PWM modulator and the A/D conversion. This also minimizes the noise interference in the signal path from the system to the amplifier. In the following description, some specific details, such as example circuits and example values for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with systems, circuits, and methods that are meant to be exemplary and illustrative. In various embodiments, the above problem has been reduced or eliminated, while other embodiments are directed to other improvements.

The present invention relates to circuits and methods of high efficient audio signal amplification. Proposed system converts an audio signal in the digital format to a PWM audio signal and then amplifies the PWM audio signal to drive a speaker. The present invention does not require any signal feedback from the amplifier's output terminal to the PWM modulator.

Figure 1A:
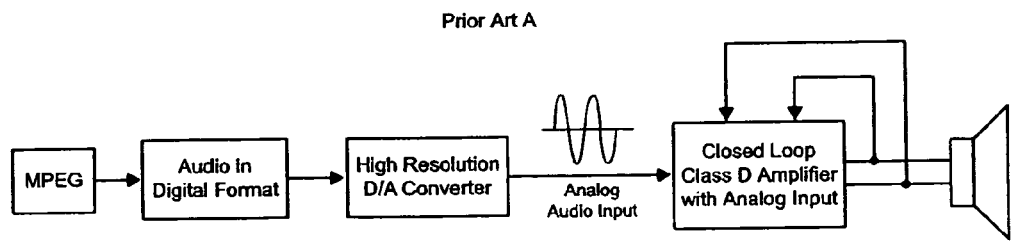
FIG. 1A is a prior art class D amplifier.
Figure 1B:
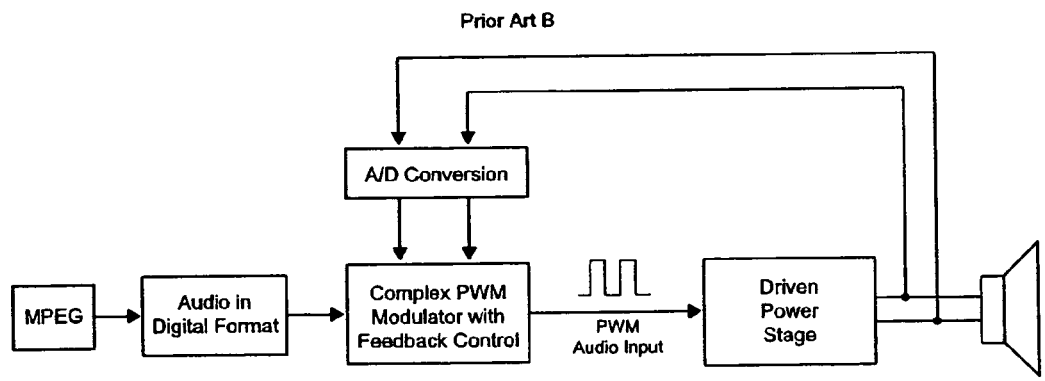
FIG. 1B is another prior art class D amplifier.
Figure 2:
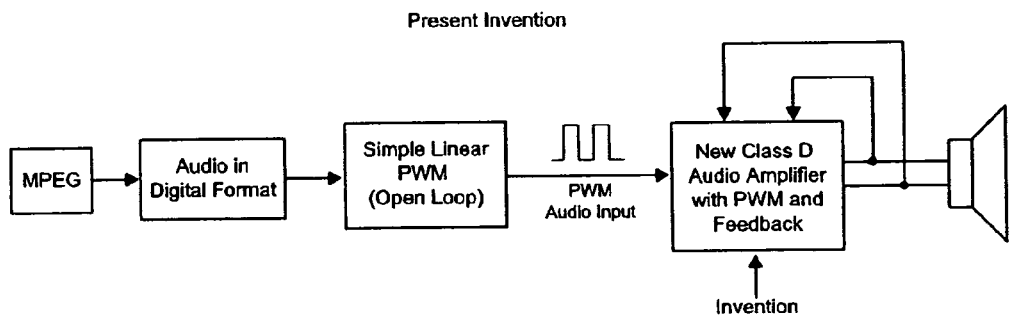
FIG. 2 shows a circuit block diagram of the present invention.

FIG. 2 shows a circuit block diagram of the present invention. An audio signal in the digital format is converted to a PWM audio signal by a simple linear PWM modulator. The linear PWM modulator is open-loop and does not require any feedback control. The PWM audio signal is input into a Class D audio amplifier that has at least one feedback loop. The output terminal of the amplifier is coupled to a load, such as a speaker.

Figure 3A:
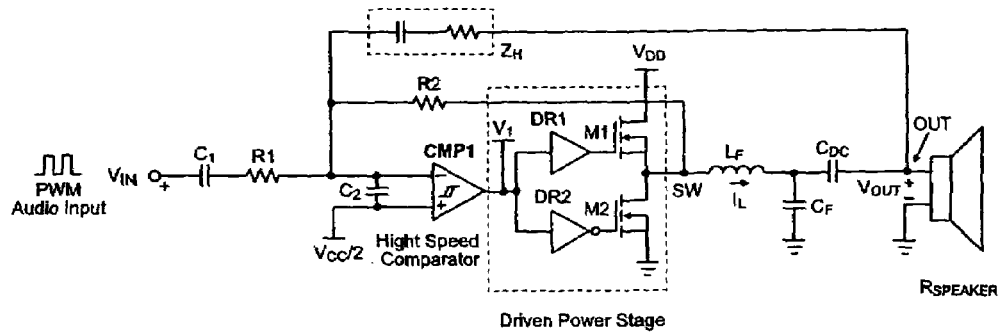
FIG. 3A illustrates an example of the present invention in a Class D Audio Amplifier.
Figure 3B:
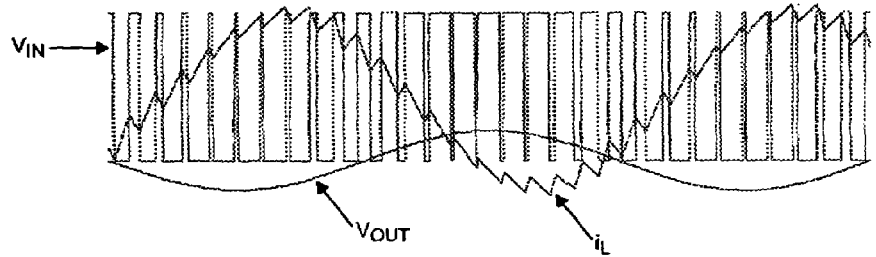
FIG. 3B illustrates operational waveforms of the circuit in FIG. 3A.

An example of the present invention in a Class D audio amplifier is illustrated in FIG. 3A and its waveforms are illustrated in FIG. 3B. A PWM audio input signal is coupled to the negative input of a high speed comparator CMP1 through a capacitor C1 and a resistor R1. C1 is the dc blocking capacitor. CMP1's positive input is coupled to a bias voltage, $VC_{cc}/2$, wherein $V_{cc}$ is the power supply for the power stage. The CMP1's two inputs are coupled to each other by a capacitor C2. The output signal of CMP1 is used to drive the output switches M1 and M2 via the gate drive circuits DR1 and DR2. M1 switches in phase with CMP1's output signal and M2 switches complementarily to M1 with some "dead" times between "ON" states of M1 and M2. The "dead" times are needed to prevent shoot-through. However, the "dead" times must be minimized in order to minimize the output distortions and power losses.

The output of the audio amplifier is fed back via a resistor R2 to the negative input of CMP1. $V_{IN}$, $V_{cc}$, R2, C2 and the input hysteresis of CMP1 determine the switching frequencies of the audio amplifier. The audio amplifier's output terminal SW is connected to an output speaker $R_{speaker}$ via a low pass filter formed by Lf and Cf, and a dc blocking cap $C_{DC}$. The low pass filter can be eliminated if the switching frequency at the node SW $f_{SW}$ is high enough. The speaker $R_{speaker}$ is coupled between an output terminal OUT and ground. In the circuit, $f_{SW}$ may not be equal to the frequency of the PWM signal $F_{PWM}$. The audio amplifier's gain is determined by the ratio R2/R1 and PWM audio amplitude can alter $V_{OUT}$ amplitude. Additionally, an RC feedback loop $Z_H$ can be used to couple OUT and CMP1's negative input to improve total harmonic distortion (THD).

Figure 4:
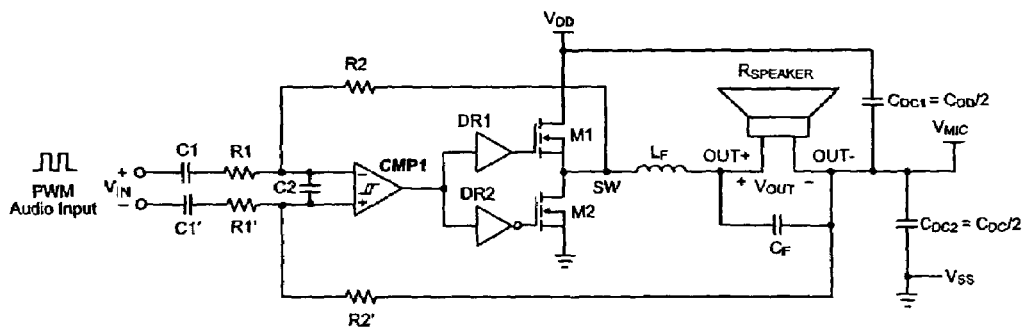
FIG. 4 illustrates a second example of the present invention in a Class D Audio Amplifier.

A second example of the present invention in a Class D audio amplifier is illustrated in FIG. 4. There are some differences between the circuits in FIG. 3A and FIG. 4. In FIG. 4, the output speaker is coupled between the LC output filter and the mid point of the power supply rail and there is no direct dc block cap in series with the speaker. The PWM audio input signal is applied to the input comparator CMP1 differentially, and the audio output is also fed back to CMP1 differentially. CMP1's negative input is coupled to the positive input signal via R1 and C1, and the output feedback signal from an output node SW via R2; while CMP1's positive input is coupled to the negative input signal via R1' and C1', and the output feedback signal from the mid point of the supply rail. This configuration improves signal to noise ratio of the audio amplifier and alleviates a potential supply pumping problem when the audio amplifier saturates. The low pass filter can be eliminated if the switching frequency at the node SW $f_{SW}$ is high enough. Both capacitors $C_{DC1}$ and $C_{DC2}$ equal to $C_{DC}/2$.

In one embodiment, R1=R1', R2=R2', and C1=C1'. The switching frequency is determined by R1, R2, C1, $V_{IN}$, $V_{DD}$, and the input hysteresis of CMP1. The audio amplifier's gain is determined by the ratio R2/R1. However, the switching frequency may not equal to the frequency of the PWM signal $F_{PWM}$. Ideally, the average value of $(V_{CC}-V_{MID})$ equals to that of $(V_{MID}-V_{ss})$. If $V_{MID}$ is forced to equal zero and $V_{cc}$ equals to $-V_{ss}$, the circuit can be applied to applications with split-supply configurations.

Figure 5:
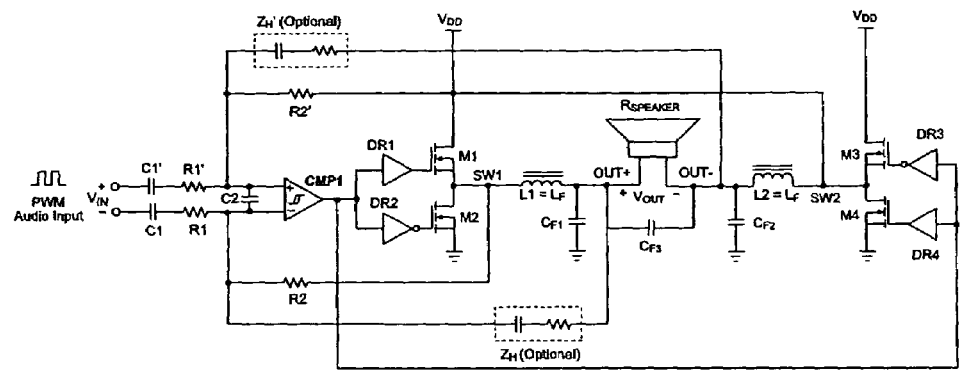
FIG. 5 illustrates a third example of the present invention in a Class D Audio Amplifier.

A third example of the present invention in a Class D audio amplifier is illustrated in FIG. 5. It has a 4-switch-output stage in a full bridge configuration and requires two additional switches and related drivers comparing with the circuits in FIG. 3A and FIG. 4. The available output power for a given supply voltage $V_{DD}$ is quadrupled. The topology is popular in the systems with low supply rail such as 5V or 12V. In the circuit, the input signal is applied to a comparator CMP1 differentially and the output is fed back to the comparator differentially, which are similar to those in FIG. 4. CMP1's output signal drives the output switches M1, M2, M3 and M4 via gate drive circuits DR1, DR2, DR3 and DR4, respectively, with M1 and M4 switching in phase with CMP1's output signal and M2 and M3 switching complementarily with CMP1's output signal. As a result, the SW1 is in phase with CMP1's output signal and SW2 is complementary with CMP1's output signal. The "dead" times exist between "ON" states of M1 and M2, and between the "ON" states of M3 and M4 to prevent the shoot-through. These "dead" times must be minimized to reduce THD and power losses associated with the body diodes of the MOSFET switches. SW1 is coupled to the positive node of the speaker OUT+ via a low pass filter L1 and $C_{F1}$; and SW2 is coupled to the negative node of the speaker OUT− via another low pass filter L2 and $C_{F2}$. There is a differential filter cap $C_{F3}$ between OUT+ and OUT−. The positive input of CMP1 is coupled to the negative input audio signal via R1 and C1, and the feedback signal from SW1 via R2; while the negative input of CMP1 is coupled to the positive input audio signal via R1' and C1', and the feedback signal from SW2 via R2'. It is recommended that L1=L2, $C_{F1}=C_{F2}$, R1=R1', R2=R2', and C1=C1'.

In the circuit of FIG. 5, $f_{sw1}$ and $f_{sw2}$ are substantially equal and are determined by R1, R2, $V_{IN}$, C1 and $V_{DD}$. The switching frequencies may not equal to the frequency of the PWM signal $F_{PWM}$. The audio amplifier's gain is determined by the ratio R2/R1. In order to improve THD, an RC feedback loop $Z_H$ can be applied to connect OUT+ with CMP1's negative terminal while another RC feedback loop $Z_H'$ can be applied to connect OUT− with CMP1's positive terminal.

Figure 6:
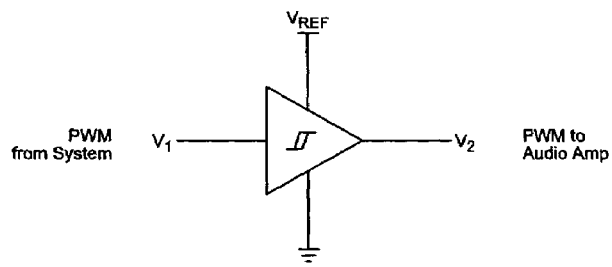
FIG. 6 illustrates an example of the input buffer.
Figure 6:
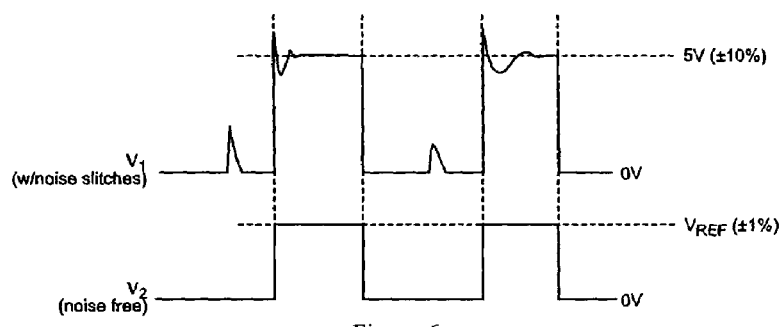

In the above circuits, the amplitude of the input PWM signal may affect the output signal while the noise glitches of the input signal may affect the quality of the output signal. In one embodiment of the present invention, an additional input buffer stage is added before inputs of each amplifier to generate a noise free PWM waveform with fixed amplitude, which is illustrated in FIG. 6. In the circuit, a Schmit trigger gate is used to clean up the noises. The input threshold of the gate has to be set properly to filter out noise glitches.

In one embodiment of the present invention, a simple linear PWM modulator is used to convert an audio signal in the digital format to a PWM audio signal. The linear PWM modulator is open-loop and does not require any feedback control or A/D converter. The PWM audio signal is amplified by a Class D audio amplifier with at least a feedback loop and then applied to a speaker. Noise is minimized since the PWM signal rather than an analog signal is used as an input signals for the amplifier. Also, the present invention does not require a complex PWM modulator with feedback control and a high speed A/D converter to connect the output terminal with the complex PWM modulator. It is much simpler and has lower cost. In another embodiment of the present invention, the Class D audio amplifier contains a high-speed comparator, drivers, power output switching devices, at least a feedback loop, and a load.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. Other variations and modifications of the embodiments disclosed herein may be made without departing from the scope and spirit of the invention.

I claim:

1. A method, comprising:
   providing a digital audio signal;
   deriving a pulse width modulated (PWM) signal from said digital audio signal through an open-loop PWM modulator and providing said PWM signal to a Class D audio amplifier comprising at least one output stage and at least one feedback loop;
   deriving an amplified audio signal from said PWM signal through said Class D audio amplifier; and
   coupling said amplified audio signal to a load;
   wherein the switching action of said output stage is modulated according to said amplified audio signal, and further wherein said Class D audio amplifier comprises:
   a high speed comparator;
   at least one driver;
   at least one inverting driver;
   at least an output stage comprising two power devices; and
   at least one feedback loop between said output stage and one input terminal of said high speed comparator.

2. The method in claim 1, wherein said power devices are MOSFET transistors.

3. The method in claim 1, wherein said Class D audio amplifier further comprises at least an RC network being coupled between one terminal of said load and one input terminal of said high speed comparator.

4. A method, comprising:
providing a digital audio signal;
deriving a PWM signal from said digital audio signal through an open-loop PWM modulator, and providing said PWM signal to a Class D audio amplifier with at least one output stage and at least one feedback loop;
deriving an amplified audio signal from said PWM signal through said Class D audio amplifier;
filtering said amplified audio signal to obtain an output signal; and
coupling said output signal to a load;
wherein the switching action of said output stage is modulated according to said amplified audio signal,
and further wherein said Class D audio amplifier comprises:
a high speed comparator;
at least one driver;
at least one inverting driver;
at least an output stage comprising two power devices;
at least a low-pass filter; and
at least one feedback loop between said output stage and one input terminal of said high speed comparator.

5. The method in claim 4, wherein said power devices are MOSFET transistors.

6. The method in claim 4, wherein said Class D audio amplifier further comprises at least an RC network being coupled between one terminal of said load and an input terminal of said high speed comparator.

7. A system, comprising:
a digital audio signal;
an open-loop PWM modulator electrically coupled to receive said digital audio signal;
a Class D audio amplifier further comprising at least one feedback loop and at least one output stage, said class D audio amplifier electrically coupled to said open-loop PWM modulator, wherein the switching actions of said at least one output stage of said class D audio amplifier is modulated according to its output signal; and
a load,
wherein said Class D audio amplifier includes:
a high speed comparator;
at least one driver;
at least one inverting driver;
at least an output stage comprising two power devices; and
at least one feedback loop between said output stage and one input terminal of said high speed comparator.

8. The system in claim 7, wherein said power devices are MOSFET transistors.

9. The system in claim 7, wherein said Class D audio amplifier further comprises at least an RC feedback loop being coupled between one terminal of said load and an input terminal of said high speed comparator.

10. The system in claim 7, wherein said Class D audio amplifier further comprises at least one low-pass filter being coupled between said output stage and said load.

11. The system in claim 10, wherein said Class D audio amplifier further comprises at least an RC network being coupled between one terminal of said load and an input terminal of said high speed comparator.

12. An apparatus for converting a Pulse-Width-Modulated (PWM) digital input signal into an analog output signal comprising:
a dc power supply;
an input stage receiving said PWM digital input signal;
at least one output stage that includes a class D audio amplifier having a feedback loop between said input stage and said output stage; and
a load with a first and a second terminals;
wherein the switching actions of said output stage is modulated according to its output signal, and further wherein there exists a feedback loop between one terminal of said load and said input stage.

13. The apparatus in claim 12, wherein said input stage comprises a high speed comparator.

14. The apparatus in claim 13, wherein said input stage comprises a buffer for said PWM digital input signal.

15. The apparatus in claim 12, wherein said first terminal of said load is directly coupled to said output stage.

16. The apparatus in claim 12, wherein said first terminal of said load is coupled to said output stage through a low pass LC filter.

17. The apparatus in claim 12, wherein said first terminal of said load is coupled to said output stage through a low pass LC filter and a DC blocking capacitor.

18. The apparatus in claim 12, wherein said second terminal of said load is coupled to ground.

19. The apparatus in claim 12, wherein said second terminal of said load is coupled to the mid point of said DC power supply.

20. The apparatus in claim 19, wherein said input stage's input terminals are coupled to the positive and negative inputs of said PWM digital input signal, and also coupled to a feedback signal from said output stage.

21. The apparatus in claim 20, wherein said input stage receives a second feedback signal from said mid point of said DC power supply.

22. The apparatus in claim 12, wherein said output stage comprises two power switches with the half bridge configuration that switch on and off complementarily based on the output signal of said input stage.

23. The apparatus in claim 22, wherein said power switches are MOSFET transistors.

24. The apparatus in claim 12, wherein said analog output signal is a current signal.

25. The apparatus in claim 12, wherein said analog output signal is a voltage signal.

26. The apparatus in claim 12, wherein said analog output signal is a power signal.

27. An apparatus for converting a Pulse-Width-Modulated (PWM) digital input signal into an analog output signal comprising:
a dc power supply;
an input stage receiving said PWM digital input signal;
at least one output stage that includes a class D audio amplifier having a feedback loop between said input stage and said output stage; and
a load with a first and a second terminals;
wherein the switching actions of said output stage is modulated according to its output signal, wherein said output stage comprises four power switches in the full bridge configuration.

28. The apparatus in claim 27, wherein one pair of said power switches on the diagonal corner of the full bridge configuration switch on and off based on the state of the output signal of said input stage.

29. The apparatus in claim 27, wherein said power switches are MOSFET transistors.

30. The apparatus in claim 12, wherein said load is a speaker.

* * * * *